United States Patent [19]

Pimbley et al.

[11] 4,450,465
[45] May 22, 1984

[54] RADIATION TRANSMISSIVE ELECTRODE STRUCTURE

[75] Inventors: Joseph M. Pimbley, Schenectady; Herbert R. Philipp, Scotia, both of N.Y.

[73] Assignee: General Electric Company, Schenectady, N.Y.

[21] Appl. No.: 304,733

[22] Filed: Sep. 23, 1981

[51] Int. Cl.³ .................................................. H01L 27/14
[52] U.S. Cl. ........................................ 357/30; 357/31; 357/59; 357/23
[58] Field of Search ............... 357/31, 30, 23 R, 23 C, 357/59

[56] References Cited

U.S. PATENT DOCUMENTS

| | | | |
|---|---|---|---|
| 3,988,613 | 10/1976 | Brown et al. | 357/30 |
| 4,024,562 | 5/1977 | Brown et al. | 357/23 C |
| 4,321,614 | 3/1982 | Bluzer et al. | 357/23 C |
| 4,323,912 | 4/1982 | Kvike et al. | 357/31 |
| 4,329,706 | 5/1982 | Crowder | 357/59 |

*Primary Examiner*—Martin H. Edlow
*Attorney, Agent, or Firm*—Julius J. Zaskalicky; James C. Davis, Jr.; Marvin Snyder

[57] ABSTRACT

In semiconductor imaging apparatus a composite electrode structure which transmits a high percentage of the radiation incident thereon and which also has high electrical conductivity is provided as the first level of a two level electrode structure.

5 Claims, 5 Drawing Figures

RADIATION TRANSMISSIVE ELECTRODE STRUCTURE

The present invention relates, in general, to electrode structures transparent to radiation and in particular to such structures incorporated in semiconductor imaging apparatus.

Semiconductor imaging apparatus includes on a common substrate an array of radiation sensing devices. The conductive lines in the array utilized for accessing the various devices thereof are constituted of transparent materials which allow transmission of radiation to the semiconductor substrate of the device. The conductive lines of such arrays are constituted of such materials as doped polycrystalline silicon. To increase the speed of operation of such imagers, the resistivity of the polycrystalline lines has been reduced by heavy doping thereof. However, the resistivity of polycrystalline silicon cannot be reduced by doping below certain minimums. In addition, heavy doping of polycrystalline silicon increases grain size thereof which is a large contributor to non-uniform etching of the polycrystalline lines and hence noise generated by the non-uniformity thereof. Polycrystalline silicon heavily doped with phosphorus has a minimum resistivity of about 0.001 ohm centimeters. Thus, a film of such heavily doped polycrystalline silicon 0.4 micron thick would have a sheet resistance of about 25 ohms per square. For high speed operation of the imaging apparatus substantially lower resistance per unit length in the conductive lines is necessary. Lower resistance per unit length in the conductive lines can be obtained by either increasing the width of the line or its thickness. While increasing the width of the line decreases the resistance per unit length, it also increases the capacitance per unit length, and accordingly does not reduce the time constant per unit length of the line to enable higher speed of operation. While increasing the thickness of the line decreases the resistance, it also decreases the transmission of radiation therethrough particularly in the blue range of the visible spectrum. As the variation of resistance with thickness is a simple inverse relationship and as the variation of transmission of radiation with thickness is an exponential inverse relationship, a significant reduction in resistance obtained by increasing the thickness of the line results in a severe reduction in transmission of incident radiation. Thus, this approach is of very limited usefulness in improving the speed of operation of the imaging apparatus.

An object of the present invention is to provide a radiation sensing array of improved performance.

Another object of the present invention is to provide a radiation transmissive electrode structure which has both enhanced radiation transmissive properties and substantially enhanced electrical conductivity.

In carrying out the present invention in an illustrative embodiment thereof there is provided a substrate of semiconductor material having a major face. The major face is provided with a plurality of surface regions arranged in a line. A layer of insulating material having a plurality of thin portions overlies the major surface with each of the thin portions in registry with a respective one of the surface regions. A first strip of a conductive material of high electrical conductivity and high melting temperature having electrode portions overlying first parts of the thin portions of the thick layer of insulating material is provided. A second strip of doped polycrystalline silicon having electrode portions overlying first strip and second and third parts of the thin portions of the thick layer of insulation is provided. The electrode portions of the first strip and the second strip constituting the conductors of a plurality of conductor-insulator-semiconductor capacitors formed with the thin portions of the insulating material and the surface regions of the substrate. Means are provided for making electrical connections to the substrate and to the first and second strips.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1:
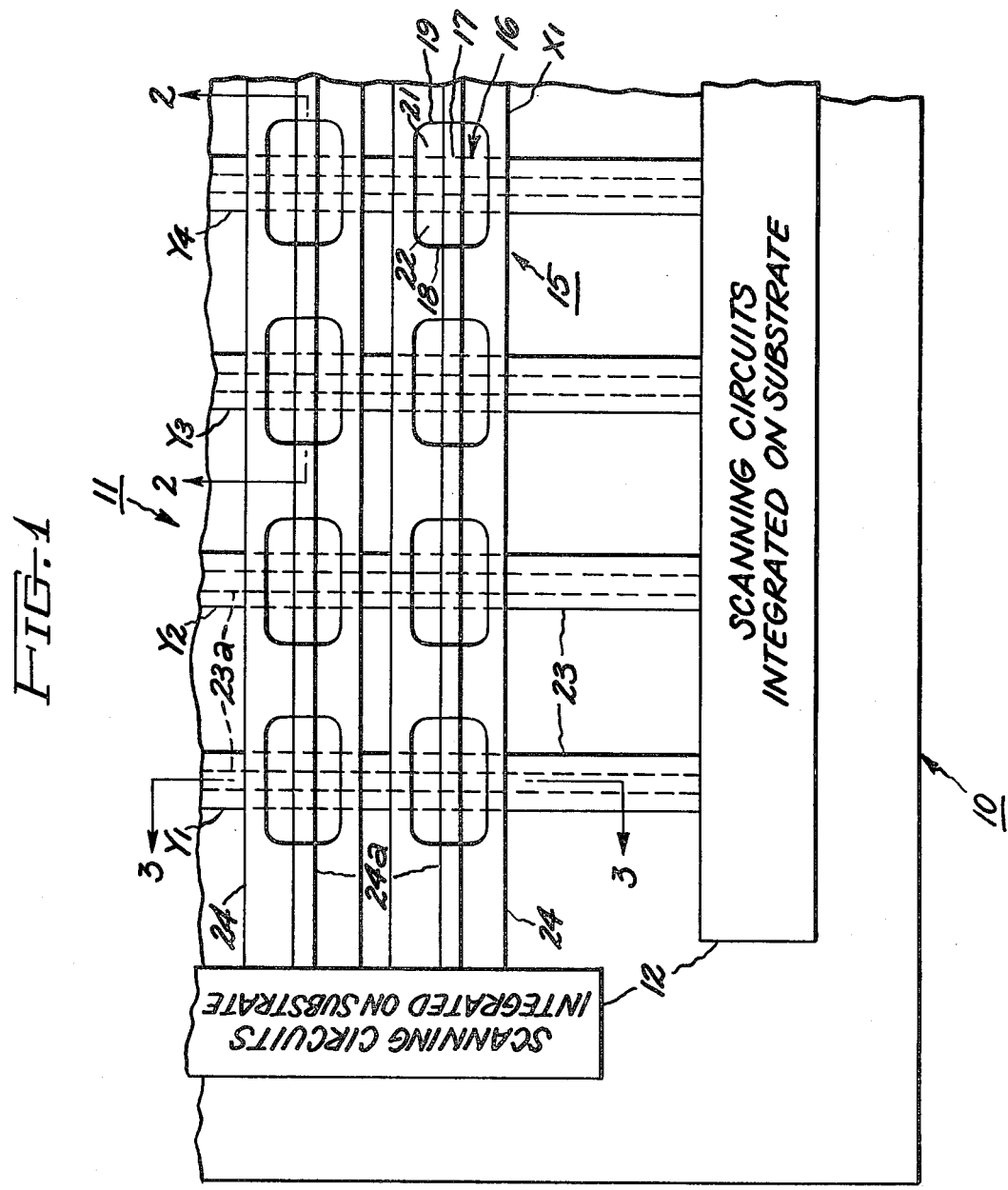
FIG. 1 is a plan view of imaging apparatus including an array of radiation responsive devices, and scanning and sensing circuits therefor embodying the present invention.
Figure 2:
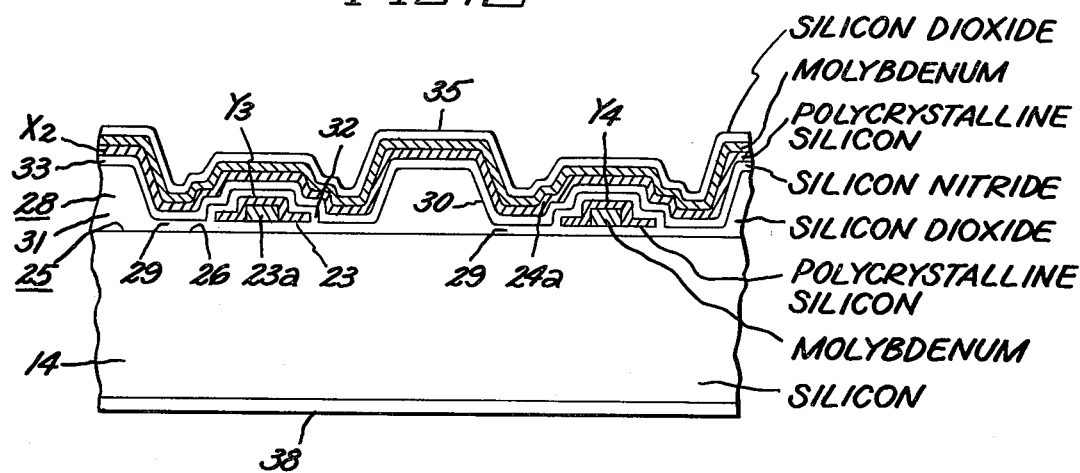
FIG. 2 is a sectional view of the apparatus of FIG. 1 taken along section lines 2—2 of FIG. 1.
Figure 3:
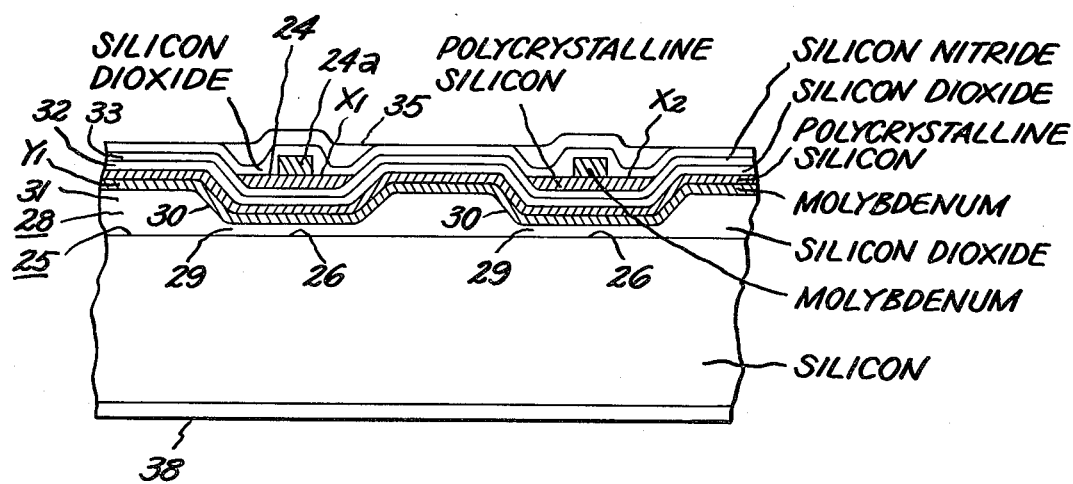
FIG. 3 is a sectional view of the apparatus of FIG. 1 taken along section lines 3—3 of FIG. 1.

Reference is now made to FIGS. 1-3 which show the present invention as embodied in an imager 10 which includes an image sensing array 11 of radiation sensing devices and circuits 12 for operating the array integrated on a common substrate 14. The array 11 is in general similar to the array described in U.S. Pat. No. 3,988,613 and assigned to the assignee of the present invention. Each device 15 of the array 11 includes a first or column CIS (Conductor-Insulator-Semiconductor) charge storage capacitor 16 of generally rectangular outline in which the plate or conductor 17 thereof is connected to and integral with the column conductor line or strip of the column in which the device is located and a pair of row CIS charge storage capacitors 18 and 19, collectively designated as a second charge storage capacitor, each adjacent a respective side of the column CIS charge storage capacitor 16 in which the plates or conductors 21 and 22 thereof are connected to and are integral with the row conductor line or strip of the row in which the device is located. The radiation sensing devices 15 are arranged in two rows and four columns. The array includes two row conductor lines or strips designated $X_1$ and $X_2$ from bottom to top. The electrode portions of each row line constitute the row plates of a respective row of devices. The array also includes four column conductor lines or strips orthogonally oriented with respect to the row conductor lines designated $Y_1$–$Y_4$ from left to right. The electrode portions of each column line constitute the column plates of a respective column of devices.

In accordance with the present invention the column lines $Y_1$–$Y_4$ are of a composite structure including a narrow and thick strip 23a of a high conductivity and high melting temperature material such as molybdenum which is covered with a wide and thin strip 23 of moderately doped polycrysalline silicon. With such a structure the resistance of the column lines is very substantially reduced without significant reduction of the transmission of radiation therethrough by the provision of a strip 23a of highly conductive material such as molybdenum underlying the relatively wide strip 23 of polycrystalline silicon. The strip of polycrystalline silicon can be reduced in thickness thereby enabling transmission of a greater portion of the radiation incident thereon without appreciably increasing the resistance of the column lines as its resistance is determined principally by the resistance of the strip of molybdenum. In addition, as the strip of polycrystalline silicon is moderately doped and consequently of relatively moderate grain size, it may be readily etched to precise width dimensions, thereby providing a reduction in noise in the operation of the array arising from this cause.

The row lines are also of a composite structure including a wide and thin strip 24 of moderately doped polycrystalline silicon and an overlying narrow and thick strip 24a of molybdenum. With such a structure the resistance of the row lines is also very substantially reduced without significant reduction of the transmission of radiation therethrough by the provision of a highly conductive material such as molybdenum overlying the relatively wide strip of polycrystalline silicon. The strip of polycrystalline silicon can be reduced in thickness thereby enabling transmission of a greater portion of the radiation incident thereon without appreciably increasing the resistance of the row lines as its resistance is determined principally by the resistance of the strip of molybdenum. In addition, as the strip of polycrystalline silicon is moderately doped and consequently of relatively moderate grain size, it may be readily etched to precise width dimensions, thereby also providing a reduction in noise in the operation of the array arising from this cause.

The array is formed on a substrate or wafer 14 of semiconductor material having a major surface 25 in which are provided a plurality of surface regions 26. The surface regions 26 are arranged into a plurality of rows and columns. The surface regions 26 are of substantially identical area and outline. As shown, the surface regions 26 are of generally rectangular outline with the long sides parallel to the row direction and the short sides parallel to the column direction. A thick layer 28 of silicon dioxide overlies the major surface and has a plurality of thin portions 29, each in registry with a respective one of the surface regions 26. The thin portions are provided by forming deep recesses 30 in the thick insulating layer 28. Thus, the insulating layer 28 includes thick or ridge portions 31 surrounding a plurality of thin portions 29 in the bottoms of the recesses 30. A plurality of column conductor lines $Y_1-Y_4$ each of the same and uniform width are provided overlying the layer of insulation 28. Each column conductor line is in traversing relationship to the surface regions 26 of a respective column of surface regions and overlying fixed first portions of the surface regions 26 of the respective column. The portions of the column conductor lines overlying the surface regions 26 constituting the conductors or electrodes of a plurality of first conductor-insulator-semiconductor capacitors formed with the thin portions 29 of the insulating layer 28 and the substrate 14. A plurality of row conductor lines $X_1$ and $X_2$ each of the same and uniform width are provided insulatingly overlying the column conductor lines. Each row conductor line is in traversing relationship to the surface regions 26 of a respective row of surface regions and overlying entirely the surface regions of the respective row. The portions of the row conductor lines overlying the surface regions 26 not shielded or masked by the column conductor lines constituting the electrodes 21 and 22 of a plurality of second conductor-insulator-semiconductor capacitors formed with the thin portions 29 of the insulating layer and the substrate. Each second conductor-insulator-semiconductor capacitor includes a pair of capacitors 18 and 19 both of which are coupled to a respective first conductor-insulator-semiconductor capacitor 16.

The imaging sensing array 11 and the devices 15 of which they are comprised may be fabricated using a variety of materials and in a variety of sizes in accordance with established techniques for fabricating integrated circuits. One example of an array using specific materials and specific dimensions will be described. The semiconductor starting material is a wafer of monocrystalline silicon of N-type conductivity of about 4 ohm-cm resistivity and having a major surface along the (111) crystallographic plane thereof and conveniently 10 mils thick. The insulating layer 28 comprises thermally grown silicon dioxide with the thin portions 29 thereof having a depth of approximately 0.1 micron. The thin portions 29 are separately grown after etching of an initially uniform thick layer of about 1.5 microns of the thermally grown silicon dioxide to form openings therein and to define the surface storage regions 26 in the major face 25 of the substrate. The column lines $Y_1-Y_4$ and the conductors of the first CIS capacitors thereof are composite structures of moderately doped polycrystalline silicon and molybdenum as described above. The row lines $X_1-X_2$ and the split conductors or electrodes 21 and 22 of second CIS capacitors are also composite structures of moderately doped polycrystalline silicon and molybdenum as described above. The dimensions of the active surface region 26 of each of the devices are approximately 1.3 mils by 0.9 mil. The centers of the active regions are spaced in the horizontal or row direction approximately 1.7 mils apart and the centers of the active regions in the vertical or column direction are spaced approximately 1.3 mils apart. An insulating layer 32 of silicon dioxide of approximately 0.1 micron surrounds the column strips or lines $Y_1-Y_4$ of polycrystalline silicon. A layer about 0.1 micron of silicon nitride 33 is provided between the column line stripes $Y_1-Y_4$ and the row line stripes $X_1$ and $X_2$.

In the fabrication of the array a thick layer of field oxide approximately 1.5 microns thick is thermally grown on a major surface of the N-type silicon wafer of 4 ohm-cm resistivity. Openings extending to the major surface of the silicon wafer are formed in the oxide layer exposing the active surface regions 26 in the major surface using conventional photolithographic techniques and thereafter thin portions 29 of silicon oxide approximately 0.1 micron thick are thermally grown over the active surface regions 26. A layer of molybdenum is sputtered over the thick and thin portions of the insulating layer to a suitable thickness, for example, 0.5 microns. Thereafter, the molybdenum is patterned by photolithographic masking and etching to provide the narrow strips of molybdenum, as shown. An etch suitable for this purpose consists of phosphoric acid, water, acetic acid, and nitric acid in the relative proportions of 380:75:30:15, respectively. The etch would be used with Waycoat negative photoresist. A thin layer of polycrystalline silicon is then vapor deposited by decomposition of silane at a temperature of about 1000° C. to a thickness of approximately 0.2 micron. Thereafter, the polycrystalline silicon is doped moderately conductive N-type using phosphorous oxychloride vapor. The polycrystalline silicon layer is then patterned into the strips 23 which, along with the molybdenum strips 23a, form the column conductors or electrodes of the devices 15 as well as the column conductor lines $Y_1-Y_4$ thereof. After removal of the patterning oxide from the polycrystalline silicon strips, thermal oxide is grown at a temperature of about 1000° C. on polycrystalline lines to a thickness of approximately 0.1 micron.

In order to protect the active surface regions of the substrate as well as the thermally grown oxide overlying the active surface regions from environmental contamination and also to assure good electrical isolation of the row and column lines, a layer of silicon nitride 33 approximately 0.1 micron thick is chemically vapor deposited using silane and ammonia in a hydrogen atmosphere at a temperature of about 1000° C. The silicon nitride layer 33 is suitably patterned to cover both the area of the array in which the devices 15 are located and the portion of the imager in which are located the scanning and signal processing circuits. A thin layer of polycrystalline silicon is vapor deposited on the layer of silicon nitride by decomposition of silane at a temperature of about 1000° C. to a thickness of approximately 0.2 microns. The layer of polycrystalline silicon is moderately doped using phosphorous oxychloride vapor. The polycrystalline layer is then patterned into the strips 24 which form the row conductors or electrodes of the devices as well as the row lines $X_1$ and $X_2$. Narrow strips 24a of molybdenum are formed on the wide strips 24 of polycrystalline silicon by sputtered molybdenum over the wide strips to a suitable thickness, for example, 0.5 micron, and after patterning a layer 35 of silicon dioxide approximately 0.4 micron thick is then formed over the composite strips of polycrystalline silicon and molybdenum by chemical vapor deposition using silane and oxygen. The silicon dioxide layer 35 is suitably patterned to cover the imaging area of the array.

Concurrently with the formation of the array of radiation sensing devices 15 the various active and passive devices of the scanning and signal processing circuits 12 of the imager are formed on the substrate. Interconnections are then made between the various active and passive devices of the operating circuits and between the various conductive lines 23a and 24a of the array and the operating circuits.

Figure 4:
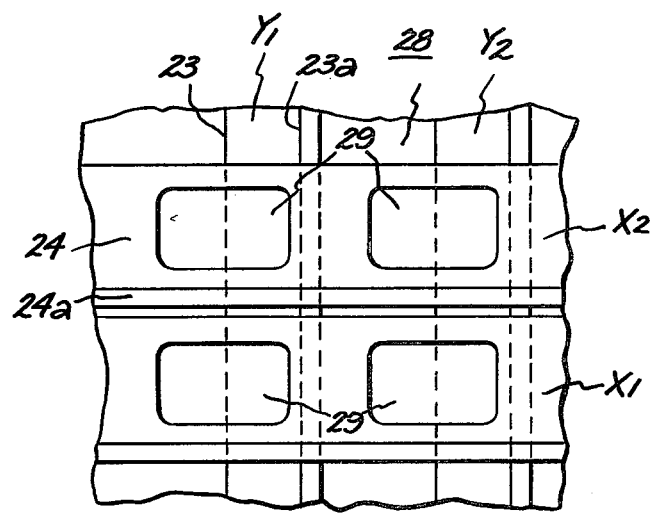
FIG. 4 is a plan view of a portion of an imaging array illustrating another embodiment of the present invention.

Reference is now made to FIG. 4 which shows another embodiment of the present invention. This embodiment is similar to the embodiment of FIG. 1 and identical elements are identically designated. In this embodiment, each of the column lines overlies one side of the thin oxide regions 29 of a respective row and includes a portion overlying the thick portions 31 of the insulating layer 28. The narrow conductive strips 23a are situated underlying those portions of the column conductor lines overlying the thick regions of the insulating layer 28. In this embodiment, each of the row lines overlies the other side of the thin oxide regions 29 of a respective column and includes a portion overlying the thick portions 31 of the insulating layer 28. Also the narrow conductors 24a overlying the row lines $X_1$ and $X_2$ are situated on these lines over the portions thereof which overlie the thick insulating regions 31 of the insulator 28. Thus, any blockage of light transmission to the surface regions 26 of the substrate is completely eliminated. In other respects the array of FIG. 4 is identical to the array of FIG. 1.

Figure 5:
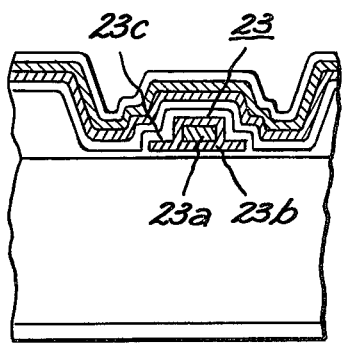
FIG. 5 is a plan view of a portion of an imaging array illustrating a further embodiment of the present invention.

Reference is now made to FIG. 5 which shows a sectional view similar to the sectional view of FIG. 2 of another embodiment of the present invention. This embodiment is similar to the embodiment of FIG. 1 and identical elements are identically designated. In this embodiment, the column conductor lines $Y_1-Y_4$ are constituted of a thin bottom layer 23b of moderately doped polycrystalline silicon and intermediate narrow layer 23 of molybdenum and a top thin layer 23c of polycrystalline silicon overlying both the bottom layer and the layer of molybdenum. In other respects, the array of FIG. 5 is identical to the array of FIG. 1.

While the invention has been described and illustrated in connection with lower level composite electrode structures comprising a narrow and thick layer of molybdenum, other highly conductive members constituted of such materials as molybdenum silicide, gold aluminum ($AuAl_2$) which are able to withstand the processing temperatures utilized in the fabrication of the device can be used as well in place of molybdenum. Also while in the row conductor lines, the narrow conductor member 24a is constituted of molybdenum, other materials such as molybdenum silicide, gold aluminum as well as aluminum may be utilized.

While the invention has been described in specific embodiments, it will be understood that modifications such as those described above, may be made by those skilled in the art and it is intended by the appended claims to cover all such modifications and changes as fall within the true spirit and scope of the invention.

What is claimed is:

1. A radiation sensing array comprising
a substrate of semiconductor material having a major surface,
said substrate having a plurality of surface regions arranged in a line,
a thick layer of insulating material having a plurality of thin portions overlying said major surface, each thin portion in registry with a respective one of said surface regions, each thin portion including a first part centrally located therein, a second part contiguous with one side of said first part, and a third part contiguous with the other side of said first part,
a first strip of a conductive material of high electrical conductivity having electrode portions overlying first parts of the thin portions of said thick layer of insulating material,
a second strip of doped polycrystalline silicon having electrode portions overlying said first strip and in contact therewith and second and third parts of said thin portions of said thick layer of insulating material, said electrode portions of said first strip and said second strip constituting the conductors of a plurality of conductor-insulator-semiconductor capacitors formed with the thin portions of said insulating material and said surface regions of said substrate, said second strip being substantially wider than said first strip, said second strip being substantially thinner than said first strip,
means for making electrical connections to said substrate and to said first and second strips.

2. The combination of claim 1 in which said first strip is constituted of a high conductivity, high melting temperature metallic material.

3. The combination of claim 1 including a layer of silicon dioxide overlying said second strip of doped polycrystalline silicon, each of said thin portions of said thick layer of insulation having a fourth part contiguous with said second part and a fifth part contiguous with said third part, a third strip of doped polycrystalline silicon orthogonal to said second strip and having electrode portions overlying said fourth and fifth parts of said thin portions of said thick layer of insulation, means for making electrical connections to said third strip.

4. The combination of claim 1 in which said semiconductor material is silicon.

5. The combination of claim 2 in which said metallic material is molybdenum.

* * * * *